United States Patent [19]
Kuo-Liang

[11] Patent Number: 5,842,353
[45] Date of Patent: Dec. 1, 1998

[54] APPARATUS FOR HEATING OR COOLING DRINKS

[76] Inventor: Lin Kuo-Liang, 5F, No. 12, Lane 46, Min Sheng Road, Yungho City, Taipei Hsien, Taiwan

[21] Appl. No.: 764,215

[22] Filed: Dec. 13, 1996

[51] Int. Cl.⁶ .................................................. F25B 21/04
[52] U.S. Cl. .................. 62/190; 62/3.3; 62/3.6; 62/3.2; 62/457.3; 62/457.9; 219/419; 219/432; 219/441
[58] Field of Search .............................. 62/3.64, 3.6, 3.3, 62/3.2, 457.3, 457.9, 190; 219/438, 432, 435, 385, 386, 387, 388, 425, 419, 441

[56] References Cited

U.S. PATENT DOCUMENTS

5,042,258  8/1991  Sundhar ................................. 62/457.9
5,283,420  2/1994  Montalto ................................. 219/432

*Primary Examiner*—John M. Sollecito

[57] ABSTRACT

An liquid heating and cooling apparatus for heating or cooling liquid such as drinks is disclosed. The apparatus comprises a cup-shaped container for loading the liquid, a thermo device installed in the container for heating or cooling the liquid, and a base removably attached to the lower end of the container for supplying DC power to the thermo device and controlling the cooling or heating of the liquid by controlling the direction of the DC power supplied to the thermo device when the container is attached to the base.

18 Claims, 7 Drawing Sheets

APPARATUS FOR HEATING OR COOLING DRINKS

BACKGROUND OF THE INVENTION

1. Field of the Invention

The present invention relates to a liquid heating or cooling device, and more particularly, to an apparatus for heating or cooling liquid such as drinks.

2. Description of the Prior Art

Many people like to keep some hot or cool drinks, such as coffee, tea, cola, etc., on his/her desk so that they can drink it while working. But there are several problems for getting such beverages. First, preparing such drinks is usually a problem. Preparing cool drinks usually require refrigerator or ice which are usually not available near a user's desk. And hot drinks such as hot tea or coffee require hot water or heater. This is also not readily available near a desk in most cases. A user usually has to walk somewhere else to prepare such drinks. Second, even if such drinks are prepared, it will soon become room temperature after a short period of time. Keeping a drink in a user selected temperature and make such drink readily available in a user's desk so that a user can enjoy such drink when drinking, is both an art and a difficult task, in nowadays environment.

SUMMARY OF THE INVENTION

It is therefore a primary object of the present invention to provide an apparatus which can heat or cool a drink to a target temperature set by a user in a desk environment.

It is another objective of the present invention to provide an apparatus which comprises a base and a portable container which can be detached from the base when drinking and attached back to the base for heating or cooling the drink loaded inside the container.

Briefly, in a preferred embodiment, the present invention includes an apparatus for heating or cooling liquid comprising:

(a) a cup-shaped thermo-resistent container for loading the liquid, the container comprising a lower end and an upper opening;

(b) a thermo device installed in the lower end of the container for heating or cooling the liquid; and (c) a base removably attached to the lower end of the container for supplying DC (direct current) power to the thermo device and controlling the cooling or heating of the liquid by controlling the direction of the DC power supplied to the thermo device, wherein the DC power is supplied to thermo device when the lower end of the container is attached to the base and the DC power is disconnected when the container is removed from the base. The base comprises a recess for seating the container and the lower end of the container is removably attached to the recess.

It is an advantage of the present invention that it provides an apparatus which can heat or cool a drink to a target temperature set by a user in a desk environment.

It is another advantage of the present invention that it provides an apparatus which comprises a base and a portable container which can be detached from the base when drinking and attached back to the base for heating or cooling the drink loaded inside the container.

These and other objects and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
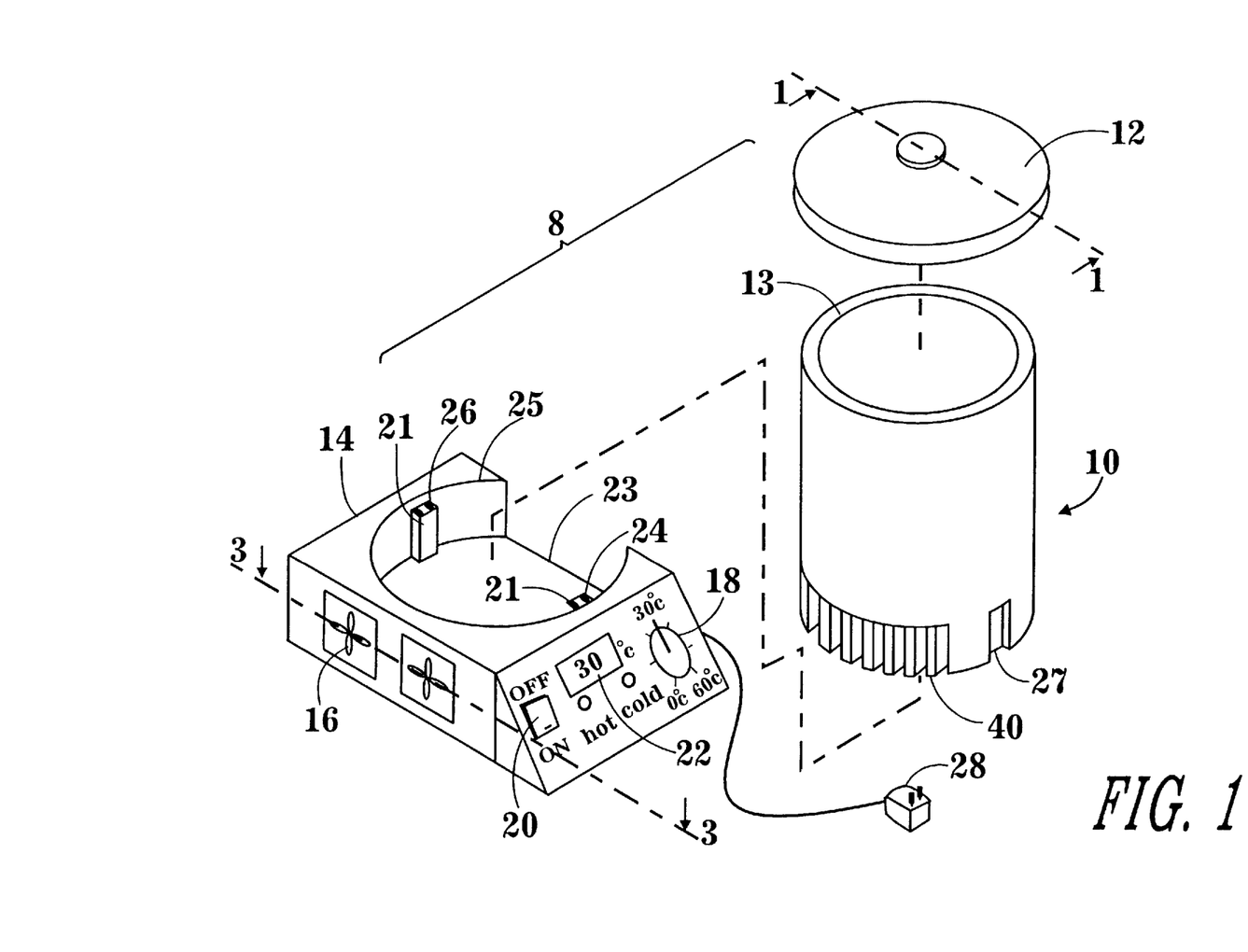
FIG. 1 is a perspective view of a liquid cooling and heating apparatus according to the present invention.
Figure 2:
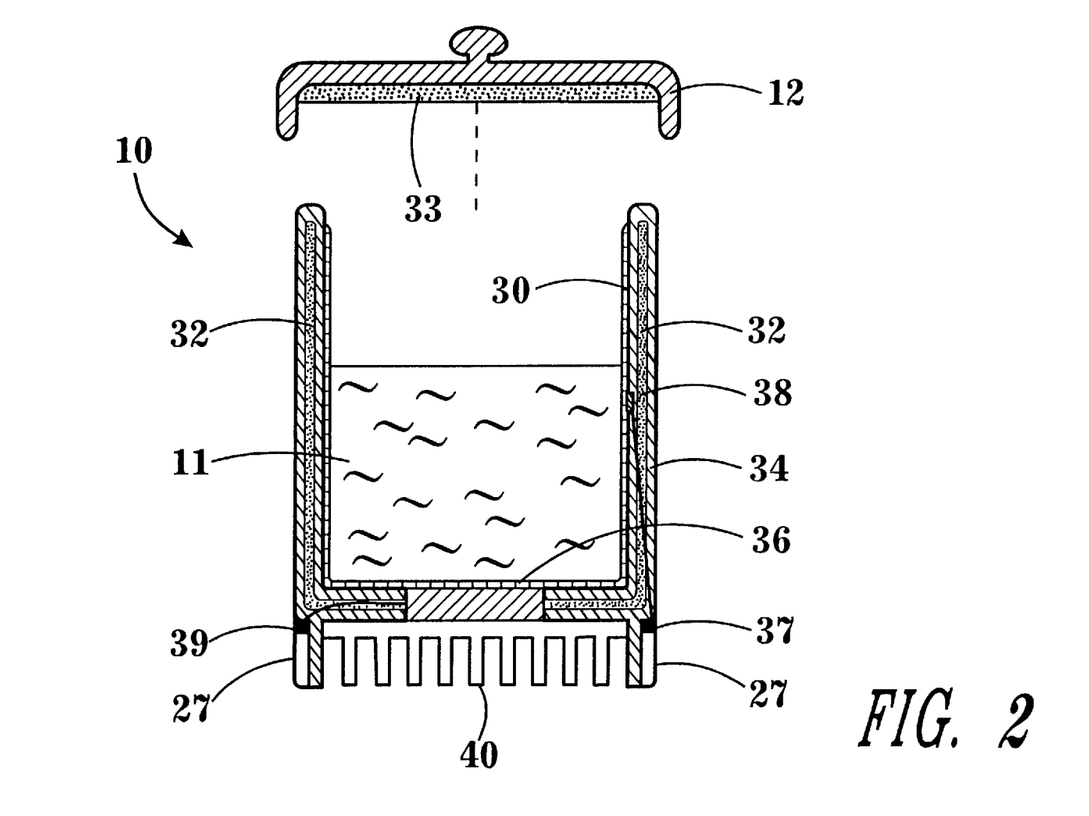
FIG. 2 is a section view 1—1 of the cup-shaped container shown in FIG. 1.

Please refer to FIGS. 1 and 2. FIG. 1 is a perspective view of a liquid cooling and heating apparatus 8 according to the present invention. And FIG. 2 is a section view 1—1 of the cup-shaped container 10 shown in FIG. 1. The apparatus 8 comprises a cup-shaped thermo-resistent container 10 having an upper opening 13 and a lower end for loading liquid 11, a thermo-resistent cap 12 removably attached to the upper opening 13 of the container 10 for maintaining the temperature of the liquid 11, a thermo device 36 installed in the lower end of the container 10 for heating or cooling the liquid 11, a base 14 removably attached to the lower end of the container 10 for supplying DC (direct current) power to the thermo device 36 and controlling the cooling or heating of the liquid 11 by controlling the direction of the DC power supplied to the thermo device, and a DC adapter 28 electrically connected to the base 14. The DC adaptor 28 is used for converting AC (alternative current) power to DC power and supplying the DC power to the base 14. Alternatively, it can be changed to a power plug for connecting to the DC power of a car when the apparatus is used in the car.

The container 10 comprises a heat conductive layer 30 made by stainless steel installed inside the container 10 which is in contact with the thermo device 36 for increasing heat exchange efficiency between the thermo device 36 and the liquid 11 and also for isolating the thermo device 36 from the liquid 11, and an outer shell wrapped around the heat conductive layer 30 for keeping the temperature of the liquid 11. The outer shell 34 can be made by plastics with thermo-resistent material 32 filled in it for preventing heat from dissipating out of the liquid 11.

The base 14 comprises a recess 25 for receiving the lower end of the container 10. The lower end of the container is removably attached to the recess 25 when heating or cooling the liquid 11. The base 14 also comprises a control circuit 50 (shown in FIG. 7) for controlling the operations of the apparatus 8.

Two grooves 27 are installed over two opposite sides of the container's lower end which are used as a latch means for latching the base 14. And two protruding studs 21 are installed over two opposite sides of the recess 25 which are used as a latch receiving means for receiving the latch means 27. And the latch means 27 of the container 10 is removably latched to the latch receiving means 21 of the base 14 when the lower end of the container 10 is attached to the recess 25 of the base 14.

The thermo device 36 is a product distributed by Flysteed International Co., located in 7F, No. 344, Fu Hsing North Road, Taipei, Taiwan. It is a thermoelectric cooling module which comprises a rectangular chip and two electric terminals. The upper and lower surfaces of the device 36 are used for heat exchange. When supplying a DC current to the device 36 through its electric terminals, heat will forced to flow either from the upper surface to the lower surface (cooling the liquid 11) or from the lower surface to the upper surface (heating the liquid 11), depending on the direction of the DC power. Cooling efficiency of the device 36 can be dramatically increased if the heat accumulating over the lower surface of the device 36 can be dissipated quickly when cooling the liquid 11. And heating efficiency of the device 36 can also be dramatically increased if the heat required to heat the liquid 11 can be quickly supplied to the lower surface of the device 36 when heating the liquid 11.

The thermo device 36 comprises an electrical connecter 39 installed on the lower end of the container 10 inside one of the grooves 27, and the control circuit 50 comprises a corresponding connector 26 installed on a corresponding stud 21 for removably connecting the connector 39 of the thermo device 36. The connectors 39 and 26 of the thermo device 36 and the control circuit 50 are connected together and the DC power from the base 14 is supplied to thermo device 11 when the lower end of the container 10 is attached to the base 14, and the DC power is disconnected when the container 10 is removed from the base 14.

The container 10 comprises a temperature sensor 38 installed in a middle portion of the container 10 for sensing the temperature of the liquid 11. The sensor 38 comprises an electrical connecter 37 installed on the lower end of the container 10 inside the other groove 27. The control circuit 50 of the base 14 comprises a connector 24 installed on a corresponding stud 21 for removably connecting the connector 37 of the sensor 38. The connectors 37 and 24 of the sensor 38 and the control circuit 50 are connected together when the lower end of the container 10 is attached to the base 14.

The base 14 further comprises a power switch 20 for turning on or off of the apparatus 8, a temperature display 22 for displaying the temperature of the liquid 11 sensed by the sensor 38, and a temperature setting means 18 for setting a target temperature by a user so that the control circuit 50 can use the sensor 38 and the thermo device 36 to heat or cool the liquid to reach the target temperature.

A heat sink 40 is installed on the lower end of the container 10 attached under the thermo device 36 for increasing heat exchange efficiency of the thermo device 36. The base 14 comprises an opening 23 installed at one side of the recess 25 for providing air ventilation for the heat sink 40 when the lower end of the container 10 is attached to the recess 25 of the base 14. The base 14 further comprises two electric fans 16 installed at the other side of the recess 25 opposite to the opening 23 for creating an air flow through the heat sink 40 and the opening 23 to increase the heat dissipation capability of the heat sink 40.

Figure 3:
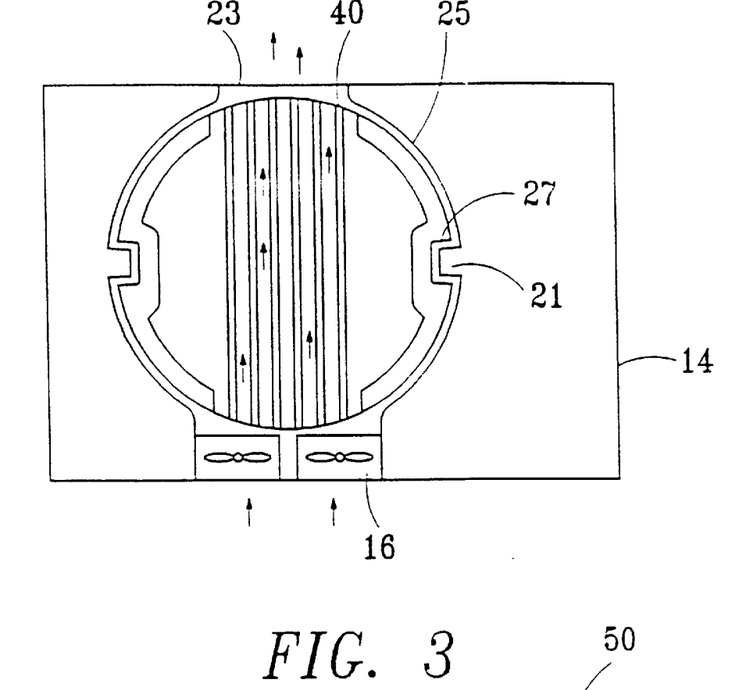
FIG. 3 is a section view 2—2 of the apparatus shown in FIG. 1 where the container is attached to the base.

Please refer to FIG. 3. FIG. 3 is a section view 2—2 of the apparatus 8 shown in FIG. 1 where the container 10 is attached to the base 14. The two grooves 27 installed at the lower end of the container 10 and the two studs 21 inside the recess 25 are used as an alignment mechanism for aligning the heat sink 40 with the fans 16 and the opening 23 so that air can fluently pass through the heat sink 40. The heat sink 40 is used to remove the heat accumulated on the lower surface of the thermo device 36 when cooling the liquid 11. But heating the liquid 11, the heat sink 40 is used to conduct heat from air into the lower surface of the thermo device 36 to increase the heating speed.

Figure 4:
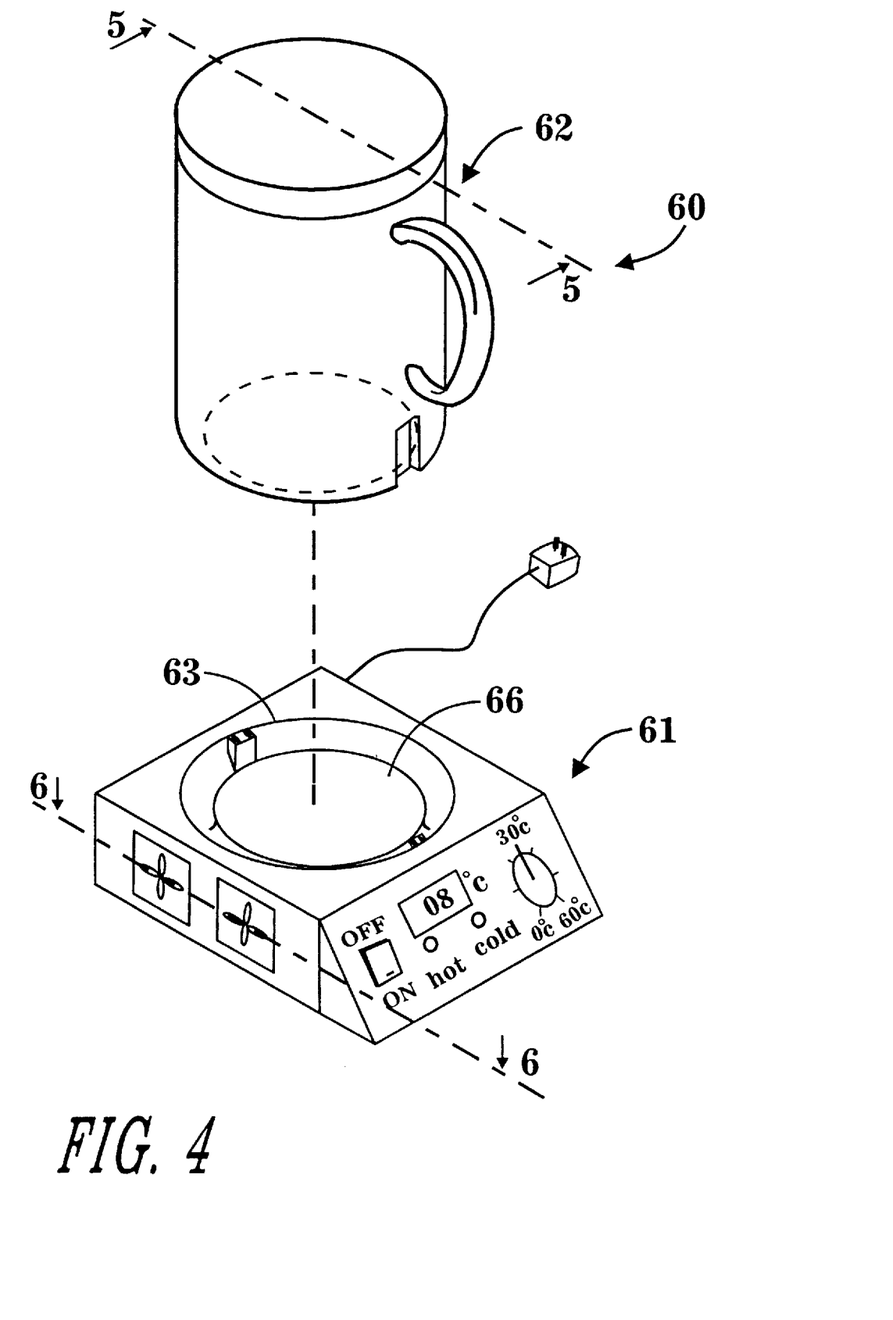
FIG. 4 is a perspective view of a liquid cooling and heating apparatus of another embodiment of the present invention.

Please refer to FIG. 4. FIG. 4 is a perspective view of a liquid cooling and heating apparatus 60 of another embodiment of the present invention. Apparatus 60 comprises a container 62 and a base 61 having a recess 63. The difference between the apparatus 60 shown in FIG. 4 and the apparatus 8 shown in FIG. 1 is the heat sink of the apparatus 60 is moved into the base 61 and there is no heat sink under the container 62. The container 60 is thus lighter and more portable than the container 10. Besides, once the container 60 is detached from the base 61, the temperature of the liquid loaded inside the container 62 can be better maintained than the liquid 11 loaded in container 10 because there is no heat sink under the container 62 to dissipate heat out of or conduct heat into the liquid loaded in the container 62.

Figure 5:
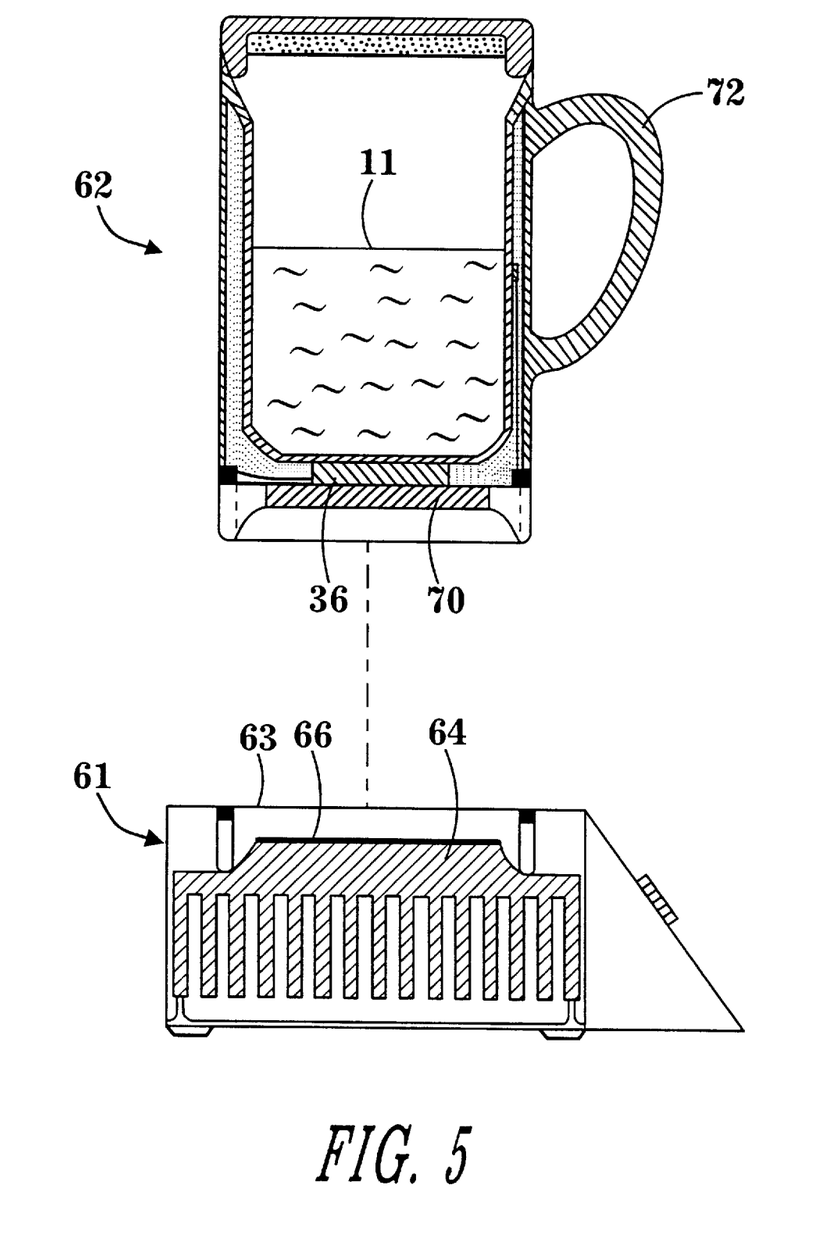
FIG. 5 is a section view 5—5 of the apparatus shown in FIG. 4.

Please refer to FIG. 5. FIG. 5 is a section view 5—5 of the apparatus 60 shown in FIG. 4. The container 62 comprises a handgrip 72, a thermo device 36 installed in the lower end of the container 62, and a heat conductive pad 70 installed on the lower end of the container 62 attached under the thermo device 36. The base 61 comprises a heat sink 64 installed in the recess 63 for contacting the heat conductive pad 70 and conducting heat out of or into the thermo device 36 through the heat conductive pad 70 when the lower end of the container is attached to the recess 63.

The base 61 further comprises a flexible pad 66 made of heat conductive material fixedly installed on top of the heat sink 64 for contacting the heat conductive pad 70 of the container 62 to increase heat conductivity between the heat sink 64 of the base 61 and the heat conductive pad 70 of the container 62.

When the container 62 is attached to the recess 64 of the base 61, the weight of the container 62 and the liquid 11 will press the heat conductive pad 70 of the container 62 against the flexible pad 66. The more liquid 11 loaded inside the container 62, the higher pressure is exerted over the flexible pad 66 by the heat conductive pad 70. Such design allows excellent heat conductivity maintained between the heat conductive pad 70 and the heat sink 64 and no other facility is needed for fixing or fastening the container 62 to the base 61.

Figure 6:
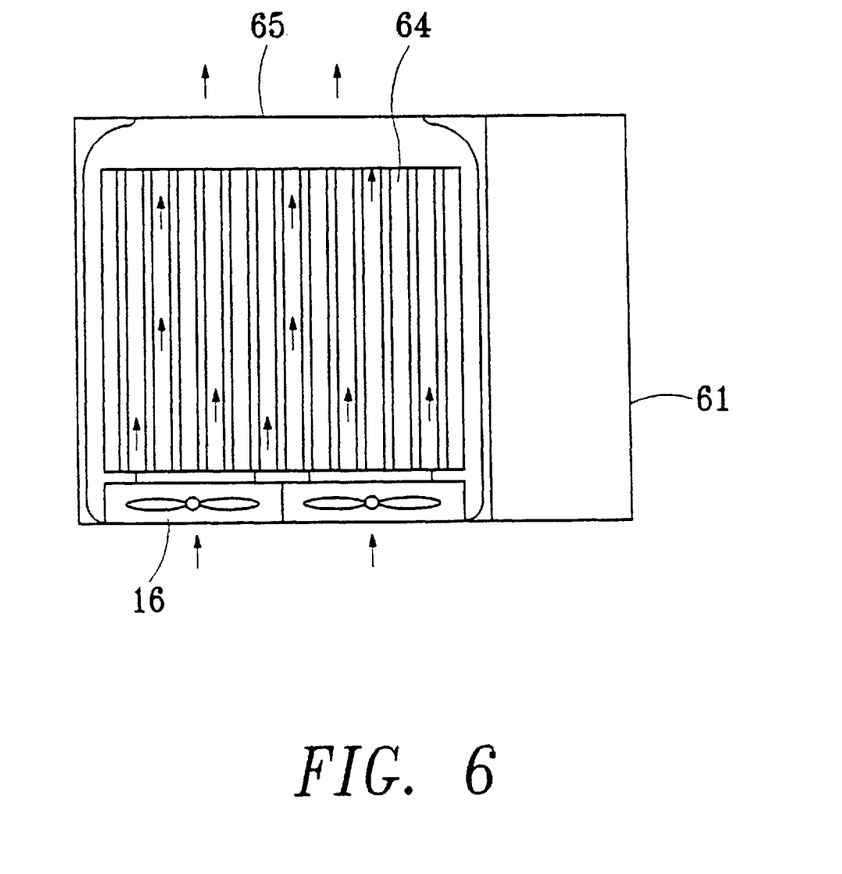
FIG. 6 is a section view 6—6 of the base shown in FIG. 4.

Please refer to FIG. 6. FIG. 6 is a section view 6—6 of the base 61 shown in FIG. 4. It shows that the base 61 comprises an opening 65 installed at one side of the base 61 for ventilating air through the heat sink 64. The base 61 further comprises two electric fans 16 installed at the other side of the base 61 opposite to the opening 65 for creating an air flow through the heat sink 64 and the opening 65 to increase the heat dissipating capability of the heat sink 64.

Figure 7:
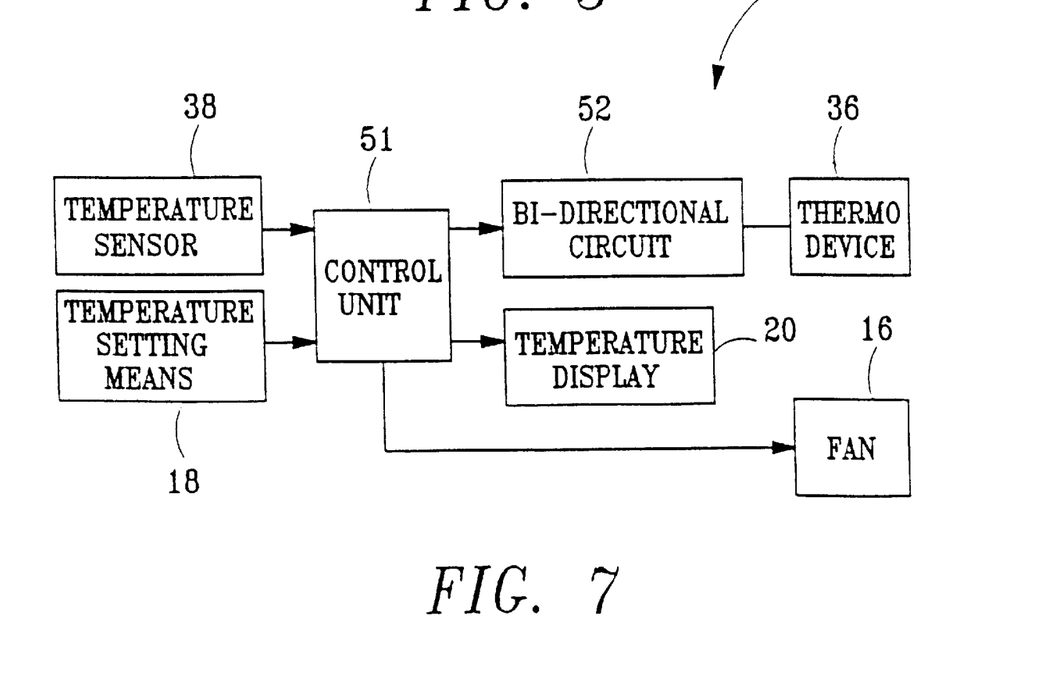
FIG. 7 is a block diagram of the control circuit used by both apparatus shown in FIG. 1 and FIG. 4 according to the present invention.

Please refer to FIG. 7. FIG. 7 is a block diagram of the control circuit 50 used by both apparatus 8 and 60 shown in FIG. 1 and FIG. 4 according to the present invention. The control circuit 70 comprises a control unit 51 for controlling the heating or cooling of the liquid 11, and a bi-directional circuit 52 controlled by the control unit 51 for supplying DC powers of various directions to the thermo device 36 to initiate the heating or cooling function of the thermo device 36. The temperature sensor 38, temperature setting means 18, temperature display 22, and the electric fans 16 are all connected to and controlled by the control unit 51. The control unit 51 uses the bi-directional circuit 52, the temperature sensor 38 and the fans 16 to control the heating or cooling of the liquid 11 to achieve the target temperature set by a user by using the temperature setting means 18.

Figure 8:
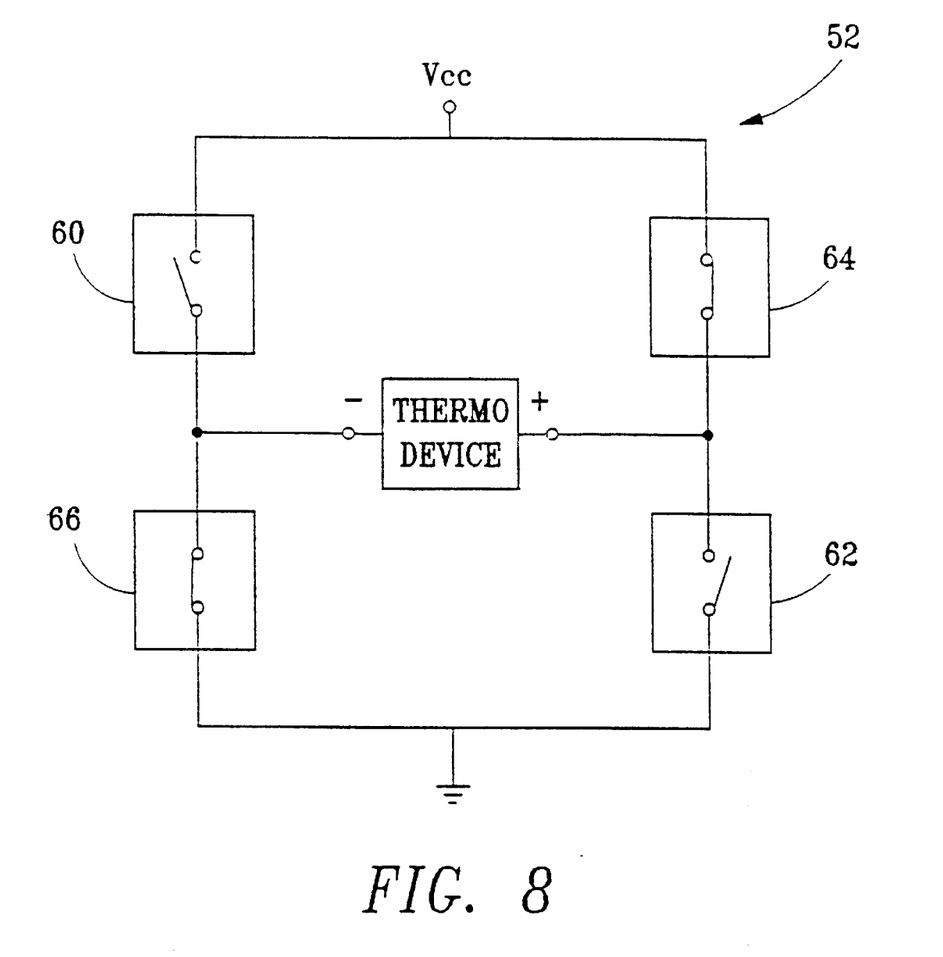
FIG. 8 is a circuit diagram of the bi-directional current supply shown in FIG. 7.

Please refer to FIG. 8. FIG. 8 is a circuit diagram of the bi-directional circuit 52 shown in FIG. 7 which is controlled by the control unit 51. It can control the direction of the DC power supplied to the thermo device 36 according to control signals from the control unit 51. Circuit 52 comprises four power switches 60, 62, 64 and 66 and each of the four switches is controlled by the control unit 51. In order to supply a positive DC power over the + terminal of the thermo device 36 when heating of the liquid 11 is required, switches 64 and 66 should be turned on and switches 60 and 62 should be turned off. If a negative DC power is required for cooling the liquid 11, switches 60 and 62 will be turned on and switches 64 and 66 will be turned off. And all the switches can be turned off to shut down the thermo device 36.

Figure 9:
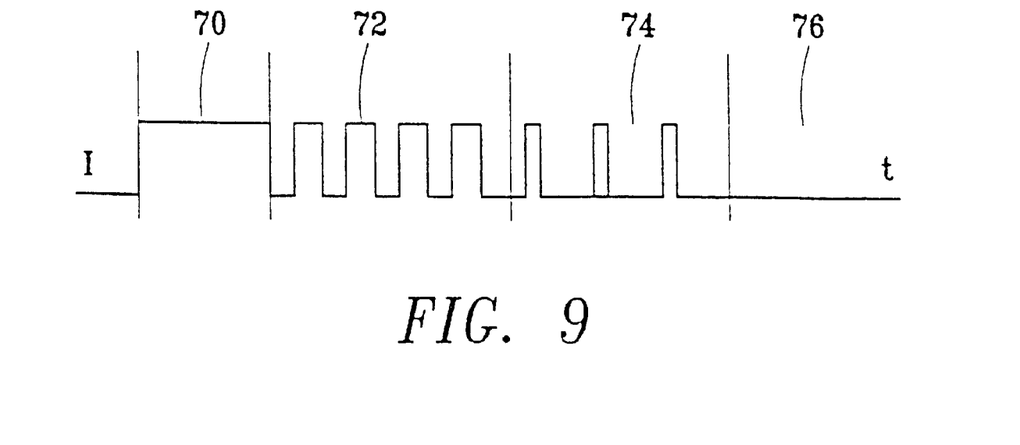
FIG. 9 is a waveform diagram for explaining a pulse width modulation method used by the control circuit according to the present invention.

Please refer to FIG. 9. FIG. 9 is a waveform diagram for explaining a pulse width modulation (PWM) method used by the control circuit 50 according to the present invention. Many methods can be used by the control unit 51 to control the heating or cooling speed of the liquid 11 to achieve the target temperature set by using the temperature setting means 18. And the PWM method shown in FIG. 9 is a preferred method used in the present invention to achieve the target temperature. FIG. 9 shows the waveform of a DC power supplied to the thermo device 36 for handling the heating or cooling speed.

The pulse width (percentage of the normal DC power) at each time period is decided according to the difference (⌂T) between the temperature of the liquid and the target temperature. FIG. 9 shows that when the temperature difference ⌂T is larger than 10° C., the pulse width can be set to 100% of the normal DC power and it is illustrated in period 70 of FIG. 9. When ⌂T is between 10° C. and 5° C., the pulse width can be set to 50% which will reduce the heating or cooling speed of the thermo device 36 also to 50% of its normal heating or cooling speed, and this is shown in region 72 of FIG. 9. When ⌂T is between 5° C. and 2° C., the pulse width is reduce to 10% and it is shown in region 76 of FIG. 9. When ⌂T is between 2° C. and 0° C., the DC power is stopped and the pulse width is reduced to 0%. This is shown in region 76 of FIG. 9. The reason for reducing the heating or cooling speed of the thermo device 36 is to prevent the liquid 11 from being over heated or over cooled. When the temperature of the liquid 11 get closer to the target temperature, the PWM method will reduce the heating or cooling speed of the thermo device 36 so that the liquid 11 will not be over heated or cooled. The fans 16 can also be controlled in a similar manner. For example, the control unit 51 can turn on the fans 16 when heating or cooling the liquid 11 and turn off the fans 16 when the temperature difference is between 2° C. and 0° C. the control unit 51 can turn on the fans 16 again when ⌂T is larger than 5° C. Such design can prevent the fans 16 from being constantly turned on and off.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. Apparatus for heating or cooling liquid comprising:
   (1) a cup-shaped thermo-resistent container for loading the liquid, the container comprising a lower end and an upper opening;
   (2) a thermo device installed in the lower end of the container for heating or cooling the liquid;
   (3) a heat sink installed on the lower end of the container attached under the thermo device for increasing heat exchange efficiency of the thermo device; and
   (4) a base having a recess which is removably attached to the lower end of the container for supplying DC (direct current) power to the thermo device and controlling the cooling or heating of the liquid by controlling the direction of the DC power supplied to the thermo device;

wherein the DC power is supplied to thermo device when the lower end of the container is attached to the recess of the base and the DC power is disconnected when the container is removed from the base.

2. The apparatus of claim 1 wherein the base comprises an opening installed at one side of the recess for providing air ventilation to the heat sink when the lower end of the container is attached to the recess.

3. The apparatus of claim 2 wherein the base further comprises an electric fan installed at the other side of the recess opposite to the opening for creating an air flow through the heat sink and the opening to increase the heat dissipation capability of the heat sink.

4. The apparatus of claim 1 wherein the container comprises a latch means installed over its lower end, and wherein the base further comprises a latch receiving means installed in the recess for receiving the latch means, wherein the latch means of the container is removably latched to the latch receiving means of the base when the lower end of the container is attached to the recess of the base.

5. The apparatus of claim 1 wherein the container comprises a heat conductive layer installed inside the container which is in contact with the thermo device for increasing heat exchange efficiency between the thermo device and the liquid and also for isolating the thermo device from the liquid.

6. The apparatus of claim 1 further comprising a thermo-resistent cap removably attached to the upper opening of the container for maintaining the temperature of the liquid.

7. The apparatus of claim 1 wherein the apparatus is a liquid cooling and heating apparatus for heating or cooling the liquid.

8. Apparatus for heating or cooling liquid comprising:
   (1) a cup-shaped thermo-resistent container for loading the liquid, the container comprising a lower end and an upper opening;
   (2) a thermo device installed in the lower end of the container for heating or cooling the liquid;
   (3) a heat conductive pad installed on the lower end of the container attached under the thermo device;
   (4) a base having a recess which is removably attached to the lower end of the container for supplying DC (direct current) power to the thermo device and controlling the cooling or heating of the liquid by controlling the direction of the DC power supplied to the thermo device; and
   (5) a heat sink installed in the recess for contacting the heat conductive pad and conducting heat out of or into the thermo device through the heat conductive pad when the lower end of the container is attached to the recess;

wherein the DC power is supplied to thermo device when the lower end of the container is attached to the recess of the base and the DC power is disconnected when the container is removed from the base.

9. The apparatus of claim 8 wherein the base further comprises a flexible pad made of heat conductive material fixedly installed on top of the heat sink for contacting the heat conductive pad of the container to increase heat conductivity between the heat sink of the base and the heat conductive pad of the container.

10. The apparatus of claim 8 wherein the base comprises an opening installed at one side of the base for ventilating air through the heat sink.

11. The apparatus of claim 10 wherein the base further comprises an electric fan installed at the other side of the base opposite to the opening for creating an air flow through the heat sink and the opening to increase the heat dissipating capability of the heat sink.

12. Apparatus for heating or cooling liquid comprising:
   (1) a cup-shaped thermo-resistent container for loading the liquid, the container comprising a lower end and an upper opening;
   (2) a thermo device installed in the lower end of the container for heating or cooling the liquid; and
   (3) a temperature sensor for sensing the temperature of the liquid;
   (4) a base having a recess which is removably attached to the lower end of the container for supplying DC (direct current) power to the thermo device and controlling the cooling or heating of the liquid by controlling the direction of the DC power supplied to the thermo device; and
   (5) a control circuit installed in the base which is electrically connected to the temperature sensor and the thermo device when the lower end of the container is attached to the base for controlling the heating or cooling of the liquid; wherein the DC power is supplied to thermo device when the lower end of the container is attached to the recess of the base and the DC power is disconnected when the container is removed from the base.

13. The apparatus of claim 12 wherein the sensor comprises an electrical connector installed on the lower end of the container, and the control circuit comprises a corresponding connector for removably connecting the connector of the sensor wherein the connectors of the sensor and the control circuit are connected together when the lower end of the container is attached to the base.

14. The apparatus of claim 12 wherein the thermo device comprises an electrical connector installed on the lower end of the container, and the control circuit comprises a corresponding connector for removably connecting the connector of the thermo device wherein the connectors of the thermo device and the control circuit are connected together when the lower end of the container is attached to the base.

15. The apparatus of claim 12 wherein the control circuit comprises a bi-directional circuit for supplying DC powers of various directions to the thermo device.

16. The apparatus of claim 15 wherein the base further comprises a temperature setting means electrically connected to the control circuit for setting a target temperature by a user and wherein the control circuit uses the bi-directional circuit and the temperature sensor to control the heating or cooling of the liquid to achieve the target temperature.

17. The apparatus of claim 12 wherein the control circuit uses a pulse width modulation method (PWM) to control the supplying of the DC power to the thermo device to achieve the target temperature.

18. The apparatus of claim 12 wherein the base comprises a temperature display electrically connected to the control circuit for displaying the temperature of the liquid sensed by the sensor.

* * * * *